United States Patent [19]
Fujimoto

[11] 4,434,435
[45] Feb. 28, 1984

[54] SOLID STATE COLOR IMAGING APPARATUS

[75] Inventor: Makoto Fujimoto, Takatsuki, Japan

[73] Assignee: Matsushita Electric Industrial Co., Ltd., Kadoma, Japan

[21] Appl. No.: 322,692

[22] Filed: Nov. 18, 1981

[30] Foreign Application Priority Data

Nov. 20, 1980 [JP] Japan .................................. 55-163880
Feb. 20, 1981 [JP] Japan .................................. 56-24420
May 14, 1981 [JP] Japan .................................. 56-73071

[51] Int. Cl.³ .............................................. H04N 9/07
[52] U.S. Cl. ........................................ 358/44; 358/47
[58] Field of Search ................................... 358/44, 47

[56] References Cited

U.S. PATENT DOCUMENTS 4,001,878 1/1977 Weimer .................................. 358/44
4,071,853 1/1978 Yamanaka ............................. 358/44
4,288,812 9/1981 Rhodes .................................. 358/44

FOREIGN PATENT DOCUMENTS 53-50923 5/1978 Japan .
1438747 6/1976 United Kingdom .................. 358/47

Primary Examiner—Tommy P. Chin
Attorney, Agent, or Firm—Cushman, Darby & Cushman

[57] ABSTRACT

A solid state color imaging apparatus is constructed by combining a solid state image sensor having a plurality of photoelectric elements disposed in two dimensional rows with parallel stripe type color filters having repetition of three or four color-filter-element stripes put in front of the image sensor.

The device is free from hitherto required severe registration between the filter and the solid state image sensor. This is accomplished by selecting relative spatial phase relation between the filtered picture elements of horizontal scanning lines in a manner that the phase relation changes for every horizontal lines which are scanned in sequence. The demodulation of the chrominance signal to produce NTSC signal is made by using synchronous demodulator.

21 Claims, 19 Drawing Figures

FIG. 3 (A) (Prior Art)
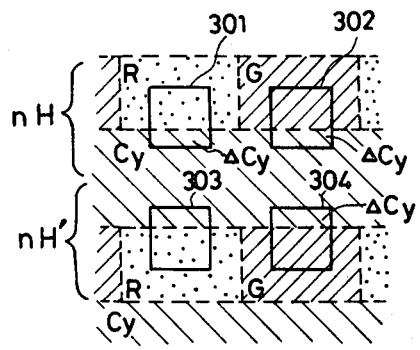
FIG. 3 (B) (Prior Art)
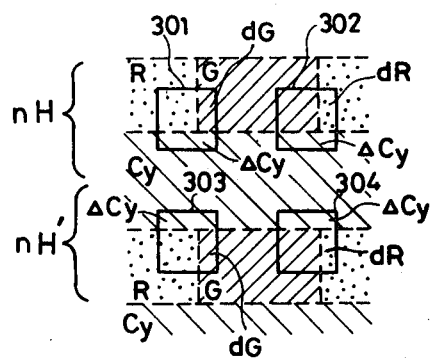
FIG. 3 (C) (Prior Art)
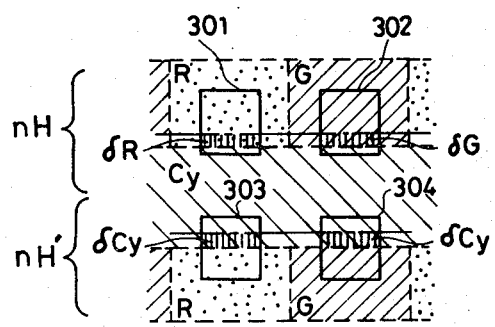

FIG. 5
(A) 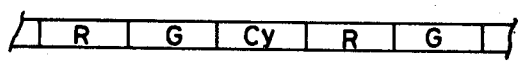
(B) 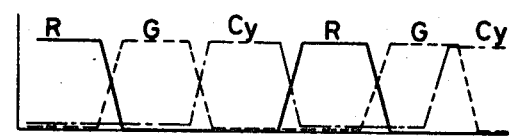
(C) 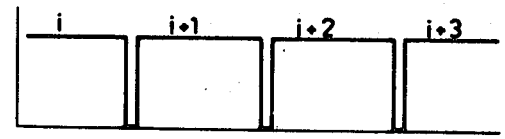
(D) 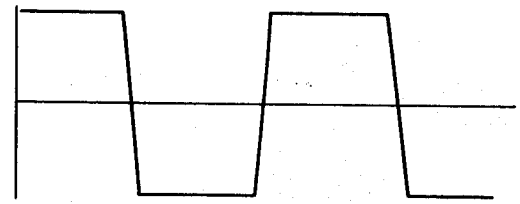
(E) 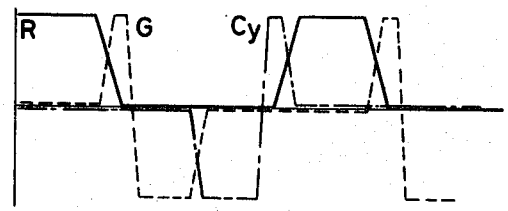

FIG.9
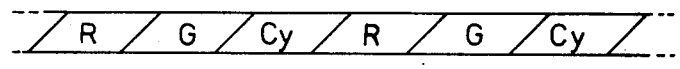
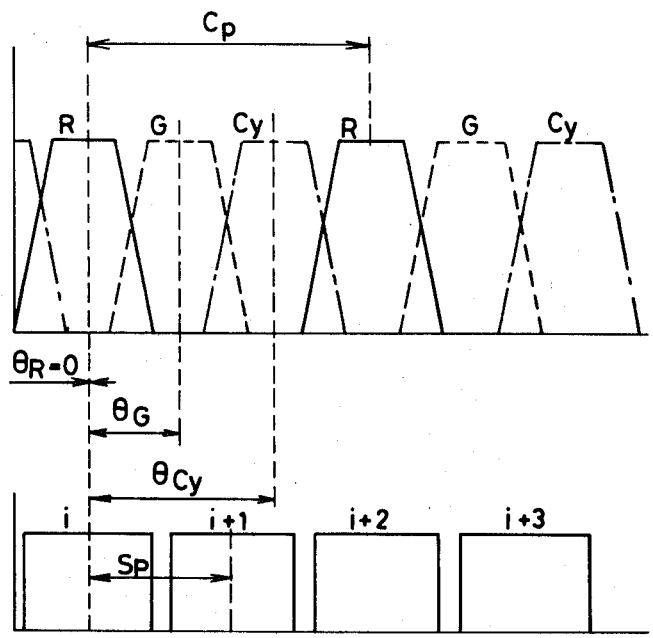
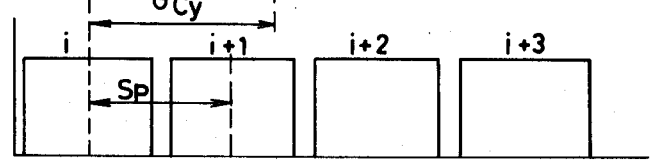
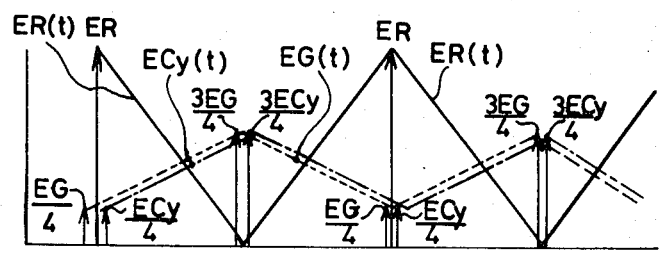

SOLID STATE COLOR IMAGING APPARATUS

BACKGROUND OF THE INVENTION

1. Field of the Invention

The present invention relates to an improvement in a solid state color imaging apparatus.

2. Description of the Prior Art

A solid state image sensor is, as is well known, an apparatus for converting objective image to an electric signal. A single chip solid state color camera is an apparatus comprising color filters of different colors in front of the solid state color image sensor, thereby to obtain an objective image on the surface of the solid state image sensor, which produces spatially modulated chrominance signal and luminance signal, enabling to synthesize a composite color signal.

On the other hand, the solid state image sensor is a kind of a large scale integrated circuit (LSI), and therefore in order to obtain a high production yield, degree of the integration of the device should be preferably low. Therefore, the number of the photoelectric elements, disposed in a two dimensional pattern on a substrate, that is the number of picture element, should be as small as possible under a condition for attaining a required resolution power of image. Accordingly, the way of producing chrominance signal should be that which does not lower theoretical value of the resolution attainable for the number of picture elements. Many proposals have been made for the modes of the pattern combination between the picture elements and the color filter thereof, and main stream thereof are those using mosaic color filter.

On the other hand, the solid state image sensor are on a stream of higher integration in order to meet a requirement of higher productivity and manufacturing yield, and according thereto the color filter to be combined therewith should also be of higher integrated pattern. This raises a hard problem that manufacture of the color filter in more highly integrated mosaic pattern is very difficult; and a more hard problem is the registration between the highly integrated picture elements on the solid state image sensor and the highly integrated color filter, a defect of which hitherto has resulted in poor quality of picture signal.

In this respect, an improvement of the solid state color imaging apparatus, wherein the registration of the color filter to the solid state image sensor is easier than conventional system, has been waited for.

The problems in the conventional type solid state color imaging apparatus are elucidated referring to FIGS. 1 to 3. FIG. 1 shows a fundamental type apparatus which uses a color filter having filter pattern of vertical color stripes comprising repetition of three primary colors in a horizontal direction. The apparatus has a solid state image sensor having a number of photoelectric elements, i.e., picture elements 101 disposed forming vertical rows and horizontal rows, and a color filter having red filter stripes 102, green filter stripes 103 and blue filter stripes 104 disposed in turn. In the signal produced based on sampling by the picture elements of the objective image which is spatially modulated by the color filter stripes, the chrominance signals for colors of the color filter are modulated by respective color filter stripes. The carrier frequency of the chrominance signal is one third ($\frac{1}{3}$) of the sampling frequency by the picture elements. In such apparatus, for objective image of a low color purity, all the picture elements on one horizontal line are sensitive, and therefore the sampling of the objective image is made by using all the picture elements on the horizontal line. In this case, the band-width of signal of the objective image sampled by picture elements is a half ($\frac{1}{2}$) of the sampling frequency of the picture elements. Therefore, the carrier of the chrominance signal is included within the band width of the luminance signal. In order to avert the undesirable inclusion of the chrominance signal carrier in the luminance signal band, the luminance signal band width has to be limited under $\frac{1}{3}$ of the sampling freuency, resulting in a disadvantage of lowering of horizontal resolution.

In order to remove the above-mentioned shorting of the first conventional type apparatus elucidated in FIG. 1, the assignee corporation (intended patentee) of the present invention has proposed another type apparatus shown by FIG. 2 (Japanese Patent Application No. Sho 51-126592, published in the Japanese Patent unexamined publication No. Sho 53-50923. In the apparatus of FIG. 2, nH designates an n—th horizontal scanning line of a first field of a frame, nH' designates an n—th horizontal scanning line of a second field of the frame, (n+1)H and (n+1)H' designate those of (n+1)—th, respectively, and so on. In this apparatus, by the n—th horizontal scannings a first color differential signal is produced, and by the (n+1)—th horizontal scannings a second color differential signal is produced, and so on. Besides, in order to make average values of liminance signal of the horizontal scannings uniform, each picture elements are divided into two parts which are covered by different color filters. For example, a picture element 201 of FIG. 2 is covered by red light passing filter element (hereinafter referred as red filter element) 202 and red stopping filter element (hereinafter referred as cyan filter element) 203 and a picture element next thereto is covered by green filter element 202' and cyan filter 203. In this example of FIG. 2, frequency of repetition of the filter elements in the horizontal direction is a half ($\frac{1}{2}$) of the frequency of repetition of the picture elements in the horizontal direction. Accordingly, the carrier frequency of spatially modulated chrominance signal becomes half of sampling frequency sampling the image object, which sampling frequency is determined by number of the picture elements.

As elucidated above, the imaging apparatus of FIG. 2 has advantage of higher resolution than the apparatus of FIG. 1. However, the problem of the construction of FIG. 2 is requiring a mosaic pattern (not of simple stripe pattern) filter and a high accuracy registration of the filter mosaic pattern and the mosaic picture element pattern. The latter requirement of registration the apparatus of FIG. 2 is elucidated in detail further referring to the figures of FIGS. 3(A), 3(B) and 3(C) exemplifying a small part of the apparatus. FIG. 3(A) shows a normal or ideal state where the filter elements and the picture elements are of accurate registration, FIG. 3(B) shows a state where the registration slips off in the horizontal direction and FIG. 3(C) shows a state where the registration slips off in the vertical direction. In these figures, the numerals 301, 302, 303 and 304 exemplify picture elements, wherein the picture elements 301 and 302 are those to be read out in an n—th horizontal scanning of a first field and the picture elements 303 and 304 are those to be read out in an n—th horizontal scanning of a second field of the same frame.

In the normal registration state of FIG. 3(A), the output signals $S_{301}$, $S_{302}$, $S_{303}$ and $S_{304}$ of the picture elements 301, 302, 303 and 304, respectively are given as follows:

$$S_{301} = \overline{R} + \Delta \overline{Cy}, S_{302} = \overline{G} + \Delta \overline{Cy} \atop S_{303} = \overline{R} + \Delta \overline{Cy}, S_{304} = \overline{G} + \Delta \overline{Cy} \Bigg\} \quad (1)$$

where $\overline{R}$ is electric signal based on red light irradiated through the red filter element.

$\overline{G}$ is electric signal based on green light irradiated through the green filter element.

$\Delta \overline{Cy}$ is electric signal based on cyan light irradiated through the cyan filter element. Mark $\Delta$ is attached to indicate the electric signal based on cyan filter which coveres only a small fraction of the picture element.

Accordingly, luminance signals $Y_{nH}$ and $Y_{nH'}$ and the color difference signals $D_{nH}$ and $D_{nH'}$ of respective fields become as follows:

$$\begin{matrix} Y_{nH} = S_{301} + S_{302} = \overline{R} + \overline{G} + 2\Delta \overline{Cy} \\ D_{nH} = S_{301} - S_{302} = \overline{R} - \overline{G} \\ Y_{nH'} = S_{303} + S_{304} = \overline{R} + \overline{G} + 2\Delta \overline{Cy} \\ D_{nH'} = S_{303} - S_{304} = \overline{R} - \overline{G} \end{matrix} \Bigg\} \quad (2)$$

Thus the luminance signals of respective fields as well as color difference signals of respective fields are equivalent each other in the normal state of registration.

Next, the case of lateral slip off of the registration shown in FIG. 3(B) is elucidated. In this case, signal components $\overline{dR}$ and $\overline{dG}$ inherent to small part of different color filters on the picture elements appear as shown in FIG. 3(B), and therefore, the output signals $S_{301h}$, $S_{302h}$, $S_{303h}$ and $S_{304h}$ of the picture elements 301, 302, 303 and 304, respectively, becomes as follows:

$$\begin{matrix} S_{301h} = (\overline{R} + d\overline{R}) + d\overline{G} + \Delta \overline{Cy} \\ S_{302h} = d\overline{R} + (\overline{G} - d\overline{G}) + \Delta \overline{Cy} \\ S_{303h} = (\overline{R} - d\overline{R}) + d\overline{G} + \Delta \overline{Cy} \\ S_{304h} = d\overline{R} + (C - d\overline{G}) + \Delta \overline{Cy} \end{matrix} \Bigg\} \quad (3)$$

Accordingly, the luminance signals $Y_{nHh}$ and $Y_{nH'h}$ and the color difference signals $D_{nHh}$ and $D_{nH'h}$ of respective fields become as follows:

$$\begin{matrix} Y_{nHh} = S_{301h} + S_{302h} = \overline{R} + \overline{G} \pm 2\Delta \overline{Cy} \\ D_{nHh} = S_{301h} - S_{302h} = (\overline{R} - 2d\overline{R}) - (\overline{G} - 2d\overline{G}) \\ Y_{nH'h} = S_{303h} + S_{304h} = \overline{R} + \overline{G} \pm 2\Delta \overline{Cy} \\ D_{nH'h} = S_{303h} - S_{304h} = (\overline{R} - 2d\overline{R}) - (\overline{G} - 2d\overline{G}) \end{matrix} \Bigg\} \quad (4)$$

As shown in the above equations, the color difference signals $D_{nHh}$ and $D_{nH'h}$ have second terms $-(\overline{G}-2d\overline{G})$, in comparison with the counterparts $D_{nH}$ and $D_{nH'}$ of the equation (2), and this means that the colors differential signals are lowered as a result of the horizontal slip off of the registration.

Next, the case of vertical slip off of the registration shown in FIG. 3(C) is elucidated. In this case, signal components $\delta \overline{R}$, $\delta \overline{G}$ and $\delta \overline{Cy}$ inherent to small part of different color filter on the picture elements appear as shown in FIG. 3(C), and therefore, the output signals $S_{301v}$, $S_{302v}$, $S_{303v}$ and $S_{304v}$ of the picture elements 301, 302, 303 and 304, respectively, becomes as follows:

$$\begin{matrix} S_{301v} = \overline{R} + \delta\overline{R} + \Delta\overline{Cy} - \delta\overline{Cy} \\ S_{302v} = \overline{G} + \delta\overline{G} + \Delta\overline{Cy} - \delta\overline{Cy} \\ S_{303v} = \overline{R} - \delta\overline{R} + \Delta\overline{Cy} + \delta\overline{Cy} \\ S_{304v} = \overline{G} - \delta\overline{G} + \Delta\overline{Cy} + \delta\overline{Cy} \end{matrix} \Bigg\} \quad (5)$$

Accordingly, the luminance signals $Y_{nHv}$ and $Y_{nH'v}$ and the color difference signals $D_{nHv}$ and $D_{nH'v}$ of respective fields becomes as follows:

$$\begin{matrix} Y_{nHv} = S_{301v} + S_{302v} = (\overline{R} + \delta\overline{R}) + (\overline{G} + \delta\overline{G}) + 2(\Delta\overline{Cy} - \delta\overline{Cy}) \\ D_{nHv} = S_{301v} - S_{302v} = (\overline{R} + \delta\overline{R}) - (\overline{G} + \delta\overline{G}) \\ Y_{nH'v} = S_{303v} + S_{304v} = (\overline{R} - \delta\overline{R}) + (\overline{G} - \delta\overline{G}) + 2(\Delta\overline{Cy} - \delta\overline{Cy}) \\ D_{nH'v} = S_{303v} - S_{304v} = (\overline{R} - \delta\overline{R}) - (\overline{G} - \delta\overline{G}) \end{matrix} \Bigg\} \quad (6)$$

As shown in the above equations, the color difference signals $D_{nHv}$ and $D_{nH'v}$ have different send terms $(\overline{G}+\delta\overline{G})$ and $(\overline{G}-\delta\overline{G})$ from each other. And furthermore, the luminance signals $Y_{nHv}$ and $Y_{nH'v}$ of the equations (6) are different from each other. Such differences between the signals of the first field and the second field leads to considerable flickering of luminance and chrominance. The same applies to the $(n+1)$—th scanning.

The above-mentioned lowering of the color differential signal and occurrence of flickering are shortcomings which is likely to occur in the apparatus using a mosaic type composite filter.

SUMMARY OF THE INVENTION

In order to solve the above-mentioned problems of the conventional solid state color imaging apparatus, the present invention can provide a novel improved apparatus wherein rather simple stripe filter is used in combination with a mosaic pattern solid state image sensor, thereby an improved manufacturing productivity and yield are attainable. The invention is made by adopting a novel theory of analyzing the modulated color differential signals, and devicing the novel demodulation method and has been proved to be advantageous in actual use by experiments.

The present solid state color imaging apparatus comprises:

a solid state image sensor comprising a plurality of picture elements regularly disposed in two dimensional patterns, the disposition comprising a row of a plurality of horizontal lines, each having a plurality of picture elements disposed at a predetermined pitch and order, a color filter comprising a row of plurality of substantially parallel stripes of color filter elements, the row having repetition of stripes of a predetermined number of color filter elements, characterized in that spatial relations between the phase of disposition of the picture elements in the horizontal lines and the phase of disposition of the repetition of stripes of the color filters are changed for every horizontal lines which are scanned in sequence.

Herein, for every horizontal lines which are scanned in sequence means that, in an interlace scanning, lines of sequentially scanned fields, for example, $n$—th line of a first field, $n$—th line of a second field, $(n+1)$—th line of the next first field and $(n+1)$—th line of the next second field, and so on in such order. Therefore, on the solid state image sensor, the every horizontal lines which are scanned in sequence means every two horizontal lines.

BRIEF EXPLANATION OF THE DRAWING

FIG. 3(A) is a further enlarged front view showing a part of a solid state imaging apparatus of the second prior art in normal registration state between its solid state image sensor and its color filter of mosaic color filter elements.

FIG. 3(B) is an enlarged front view showing the part of the solid state imaging apparatus of FIG. 3(A) in a misregistration state where its solid state image sensor horizontally slips of its color filter of mosaic color filter elements.

FIG. 3(C) is an enlarged front view showing the part of the solid state imaging apparatus of FIG. 3(A) in another misregistration state where its solid state image sensor horizontally slips of its color filter of mosaic color filter elements.

FIG. 5 is a chart of the embodiment showing spatial relation among dispostion of color filter elements (in A) in a horizontal line, relative light amounts (in B), picture element sensitivities (in C), red chrominance signal (in D), and three chrominance signals (in E).

FIG. 9 is a chart of the embodiment showing spatial relation among disposition of color filter elements (in A) in a horizontal line, relative light amounts (in B), picture element sensitivities (in C), resultant color differential signals (in D).

DESCRIPTION OF THE PREFERRED EMBODIMENTS

Figure 4:
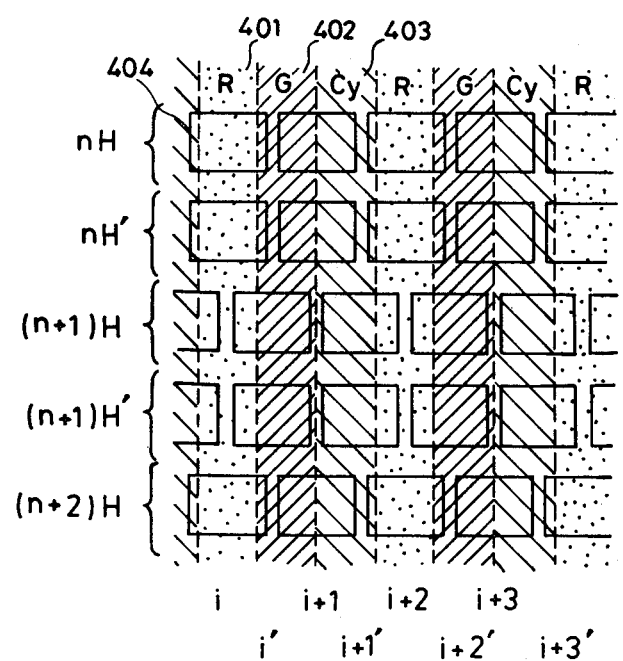
FIG. 4 is an enlarged front view showing a part of a solid state imaging apparatus embodying the present invention.

A first example of color filter and solid state image sensor is shown in FIG. 4. The filter comprises red filter elements 401 which passes red light, green filter elements 402 which passes green light and cyan filter elements 403 which stops red light or passes blue light and a bluish part of green light which are lights other than red light. These filter elements 401, 402 and 403 are formed as vertical stripes and disposed in row sequentially repeating the color of filter elements in a predetermined order, for example, R, G, Cy, R, G, Cy . . . as shown in FIG. 4. The solid state image sensor comprises a plurality of picture elements 404 on a single semiconductor substrate. On the semiconductor substrate, the picture elements are disposed in horizontal lines each having picture elements at a predetermined pitch, and a plurality of the horizontal lines are disposed parallelly on the substrate. The spatial phases of the disposition of the picture elements in horizontal lines are repeatingly shifted by 90° for every horizontal lines of sequential scannings. That is, for the example apparatus, which is for use in ordinary interlace video signal, the spatial phases are shifted by 90° for every two horizontal lines as shown in FIG. 4. In FIG. 4, the lines nH, (n+1)H, (n+2)H . . . designate horizontal lines to be scanned in the first field, and nH', (n+1)H', (n+2)H' . . . designate horizontal lines to be scanned in the second field. Therefore, in actual interlace scannings, the spatial phase of the disposition of scanned picture element shifts every scanning by 90°.

The relation between spatial frequency $f_p$ of the repitition of the picture elements in the horizontal lines and spatial frequency $f_c$ of the repetition of the stripe shaped color filter elements of the color filter is set in a relation of:

$$f_c = 0.5 f_p \qquad (7).$$

Figure 1:
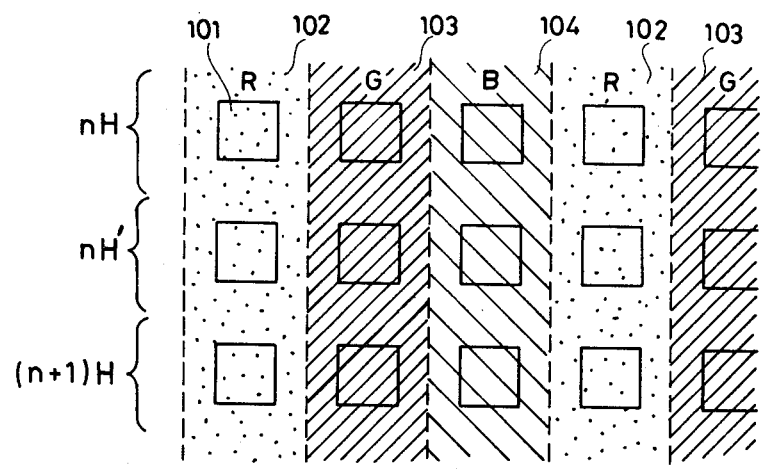
FIG. 1 is an enlarged front view showing a part of a solid state imaging apparatus of a first prior art using a color filter of vertical color stripes.
Figure 2:
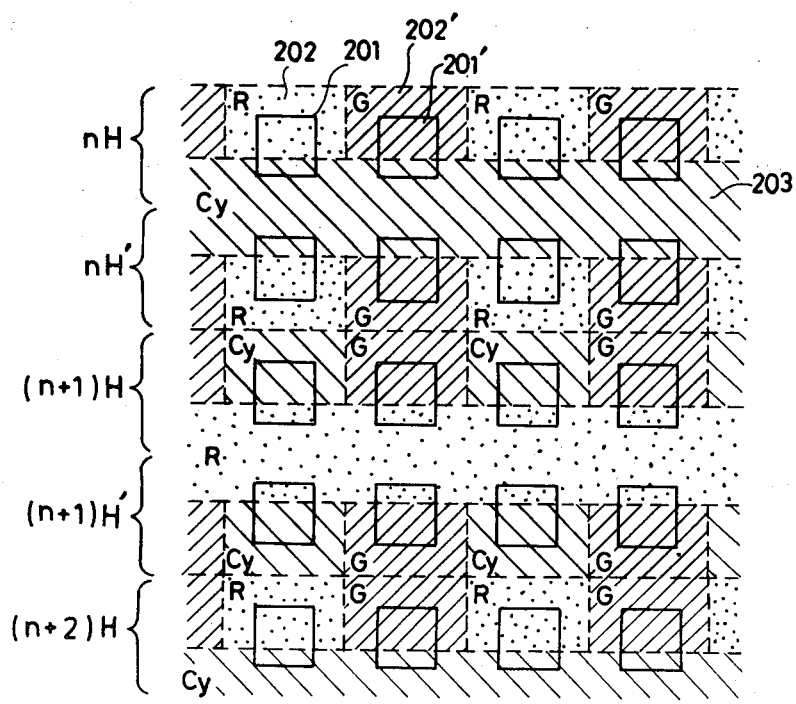
FIG. 2 is an enlarged front view showing a part of a solid state imaging apparatus of a second prior art using a color filter of mosaic color filter elements.

That is a set of three color filter element stripes are disposed on a horizontal spatial period (i.e., length) of two picture elements, as shown in FIG. 4. Accordingly, the spatial frequency of a color (for example, red) represented as spatial modulation of the output signal of the picture elements of the horizontal line is ½ of the spatial frequency of sampling by the picture elements. In other words, the spatial period (length of one repetition) of a color information represented as the spatial modulation of the output signal of the picture elements of the horizontal line is two times as long as the spatial period of sampling by the picture elements. Therefore, there is no fear that the carrier of the chrominance signal is included within the bandwidth of the luminance signal, apart from the case of the prior art elucidated referring to FIG. 1. Accordingly, in the apparatus in accordance with the present invention, a high horizontal resolution is attainable upto the limit expected for the number of picture elements on one horizontal line.

One wavelength of the carrier of the spatially modulated chrominance signal issued from the solid state image sensor is sampled by two picture elements. Accordingly, the values of the chrominance signals included in the output signal of the solid state image sensor are represented by peak to peak value of the waveforms of spatially modulated chrominance signals. That is the values of the chrominance signals are given as a difference of signals from each other neigboring i—th and (i+1)—th picture elements.

Therefore, for n—th horizontal line, the chrominance signal is produced as illustrated in FIGS. 5(A) to 5(E). FIG. 5(A) shows order of dispositions of color filter element stripes of red, green and cyan colors. FIG. 5(B) shows relative light amount of red light, green light and cyan light emanating through the color filter elements of respective colors onto the solid state image sensor under a premise that contents and amount of incident white light is uniform. FIG. 5(C) shows spatial distribution of sensitivities of the solid state image sensor, represented as an amount of [signal value/light amount]. FIG. 5(D) shows effective distribution of the sensitivity with respect to the chrominance signal for the picture elements. Since the chrominance signal is given by a difference between the output of i—th picture element and the output of (i+1)—th picture element, the effective sensitivity distribution along the horizontal line becomes as sown by the curve of FIG. 5(D). This distribution coincides with the distribution of the output of the solid state image sensor, seen through a synchronizing detector taking the frequency of repetition of the color filter as its reference frequency. Therefore, the inventors propose a novel doctorine of handling the color signal in the similar way to the synchronizing detector. According to this doctrine, the chrominance signal is given as the output of the solid state image sensor having effective sensitivity distribution of FIG. 5(D) when the sensor receives a light image having a distribution of spatial modulation produced by the color filter element stripes of FIG. 5(A). FIG. 5(E) shows such resultant outputs of the sensor, wherein solid line curve R is for red chrominance signal, dotted line curve G is for green luminance signal and chain line curve Cy is for cyan chrominance signal. FIG. 5(E) shows a chrominance signal of n—th horizontal scanning (nH). This will be understood by considering the low frequency component of the FIG. 5(E). That is, the low frequency components of FIG. 5(E) comprises positive red signal components, negative green signal components and negative cyan signal components. Therefore, the chrominance signal of FIG. 5(E) is a color differential signal R—Y as will be elucidated later. In the similar way, by considering the spatial relation between color filter elements disposition and picture elements disposition in (n+1)H (e(n+1)—th horizontal scanning), the chrominance signal becomes B—Y color differential signal. The elucidation for FIG. 5 will be made more in detail as follows: Spatial distributions L of light, which is spatially modulated by the color filter elements is given by the following equation:

$$L = R\{a_0 + a_1\cos(\omega X + \phi_1)\} + G\left(a_0 + a_1\cos\left(\omega X + \phi_1 - \frac{2\pi}{3}\right)\right) + Cy\left\{\left(a_0 + a_1\cos\left(\omega X + \phi_1 + \frac{2\pi}{3}\right)\right)\right\}. \quad (8)$$

Fundamental wave component of the distribution of the sensitivity S of the picture elements is given by the following equation:

$$S = S_1 \cos(\omega X + \phi_2).$$

Wherein:

R, G and Cy are light amounts of red, greed and cyan lights, $a_0$ and $a_1$ are constants, $\phi_1$ is spatial phase of the color filters, $\phi_2$ is spatial phase of the picture elements, $\omega$ is a spatial angular frequency, $S_1$ is an amplitude of fundamental wave component of the sensitivity S.

X is a position on the horizontal line.

Chrominance signal $C_s$ is given by $L \times S_1$ as follows:

$$C_s = L \times S_1 = a_0(R + G + Cy) \cdot S_1\cos(\omega X + \phi_2) + \quad (9)$$

$$a_1 R\cos(\omega X + \phi_1) \cdot S_1\cos(\omega X + \phi_2) +$$

$$a_1 G\cos(\omega X + \phi_1 - \tfrac{2}{3}) \cdot S_1\cos(\omega X + \phi_2) +$$

$$a_1 Cy\cos(\omega X + \phi_1 + \tfrac{2}{3}\pi) \cdot S_1\cos(\omega X + \phi_2).$$

Since for the chrominance signal $C_s$, a low frequency component only may be considered for practical usage, the chrominance signal may be represented as $$C_s = \frac{a_1 S_1}{2} \{(R\cos(\phi_1 - \phi_2) + G\cos(\phi_1 - \phi_2 + \tfrac{2}{3}\pi) + \quad (10)$$

$$Cy \cos(\phi_1 - \phi_2 - \tfrac{2}{3}\pi)\}.$$

Figure 6:
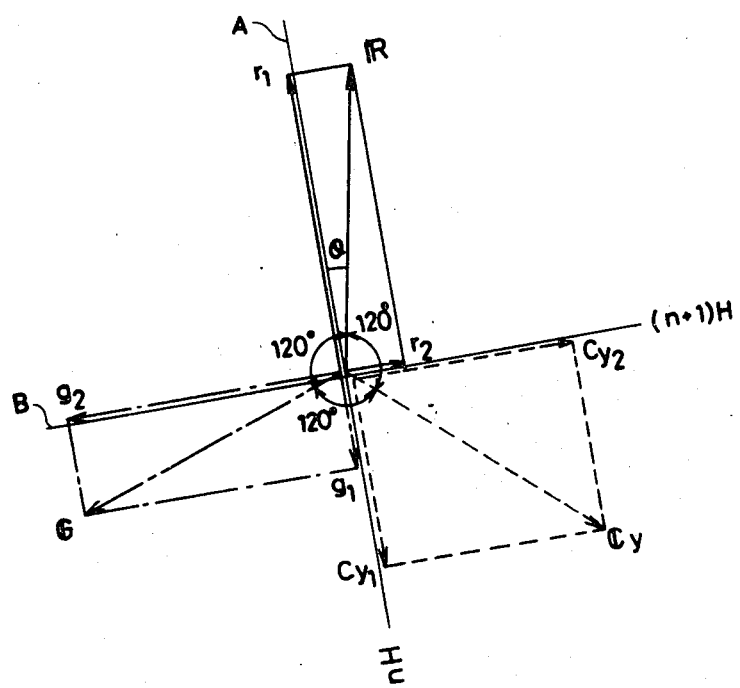
FIG. 6 is a vector diagram representing phases of three chrominance signals of the embodiment.

FIG. 6 shows the relation of the equation (10) in diagram expression, wherein vectors R, G and Cy has absolute value of $\tfrac{1}{2}(a_1 S_1) \cdot R$, $\tfrac{1}{2}(a_1 S_1) \cdot G$ and $\tfrac{1}{2}(a_1 S_1) \cdot Cy$, respectively, and has phase difference $\theta = \phi_2 - \phi_1$ for the filter's phase $\phi_1$ and picture element's phase $\phi_2$. In this diagram, signals output from the n—th horizontal scanning are given by the values $r_1$, $g_1$ and $cy_1$, which are the lengths of arrows defined by projecting the R, G and Cy to the reference line A representing the phase of modulation axis by perpendicular lines from the tips of the vectors to the line A representing the phase n—th scanning. Signals output from the (n+1)—th horizontal scanning are given by rotating the reference line from A to B by rotating by $-90°$, since in the (n+1)—th horizontal line the dispositions of the picture elements are shifted by 90° from spatial period of the n—th horizontal line. That is, signals output from the (n+1)—th horizontal scanning are given by the values $r_2$, $g_2$ and $cy_2$, which are the length of arrows defined by projecting the tips of vectors R, G and Cy to the reference line B by perpendicular lines from the tips of the vectors to the line B.

From the above-mentioned, when $\theta = 0$, the vector color differential signals $C_s(n+1)$ and $C_s((n+1)H)$ to be produced by n—th and (n H)—th horizontal scannings are given as follows:

$$C_s(nH) = R - \frac{G + Cy}{2} \quad (11)$$

$$C_s((n + 1)H) = \frac{\sqrt{3}}{2}(G - Cy).$$

In the doctrine of the present invention, the modulated color differential signals are obtainable by modulating the two vector color signals $C_s(nH)$ and $C_s((n+1)H)$ at phases corresponding to the axis A and B of FIG. 6, respectively. Relation between the phases of vectors of the primary colors included in the modulated signal is that phases of the chrominance signal components (for example, $r_1$ and $r_2$) on the modulation axis A and B and the modulation axis A and B is as shown in FIG. 6. From this relation, according to the doctrine the phase of the vectors of primary color signals R, G and Cy are reproduced by using the phases of the vector R, G and Cy, respectively. The above has been elucidation for the chrominance signal.

Hereafter, explanation will be made on the luminance signal.

Output signals from the solid state image sensor is the signal produced by converting the color lights of FIG. 5(B) from the color filter elements of FIG. 5(A) by means of picture elements of the sensitivity of FIG. 5(C). By taking the fundamental wave component of the sensitivity distribution of sensor, the sensitivity S is given by $$S = S_0 + S_1 \cos(2\omega X + \Phi) \tag{12}$$

Then the output signal Y' of the sensor is given as follows:

$$Y' = L \times S = \Big\{ R(a_0 + a_1\cos(\omega X + \phi_1)) +$$

$$G\left(a_0 + a_1\cos\left(\omega X + \phi_1 - \frac{2\pi}{3}\right)\right) +$$

$$Cy\left(a_0 + a_1\cos\left(X + \phi_1 + \frac{2\pi}{3}\right)\right)\Big\} \times$$

$$\{S_0 + S_1\cos(2\omega X + \phi)\}$$

The above equation is calculated as follows:

$$Y' = S_0 a_0 (R + G + Cy) + \tag{13}$$

$$S_0 a_1 \Big\{ R\cos(\omega X + \phi_1) + G\cos(\omega X + \phi_1 - \tfrac{2}{3}\pi) +$$

$$Cy \cos\left(\omega X + \phi_1 + \frac{2\pi}{3}\right)\Big\} +$$

$$S_1 a_0 (R + G + Cy) \cos(2\omega X + \Phi) +$$

$$S_1 a_1 \Big\{ R\cos(\omega X + \phi_1) + G\cos\left(\omega X + \phi_1 - \frac{2\pi}{3}\right) +$$

$$Cy\cos\left(\omega X + \phi_1 + \frac{2\pi}{3}\right)\Big\} \cos(\omega X + \Phi).$$

Then, by passing the above-mentioned output signal through a low-pass filter to remove the higher frequency components represent by the second terms and subsequent in the equation (13), the luminance signal Y is obtained as follows:

$$Y = S_0 a_0 (R + G + Cy) \tag{14}$$

This relation holds regardless of the spatial relation between the picture elements and the color filter elements.

As has been elucidated for the example apparatus of FIG. 4 by referring to FIGS. 5 and 6, the inventor theoretically confirmed that by shifting the spatial phase of the horizontal line of the picture element every sequential horizontal scanning by an spatial phase shift of 90°, a pair of spatially modulated signals each consisting of a color differential signal and a luminance signal are obtained.

The above-mentioned construction of the solid state imaging apparatus is especially advantageous for such solid state image sensor having very small gaps between picture elements in the horizontal direction, for instance, for an apparatus where nesa films are accumulated. Especially for such apparatus, the sensitivity distribution of the picture elements is closely analogous to the above-mentioned premises or simulation, and therefore, the theory is well exemplified.

Experiments confirmed that the chrominance signals and the luminance signal of the example of the above-mentioned construction has fundamentally no dependence on the horizontal slip off of the horizontal color filter elements disposition against the horizontal picture elements disposition. Of course, for the vertical spatial slip off of the color filter to the solid state image sensor, there is no undesirable result since the filter has only vertical stripes of filter elements. Therefore, manufacturing yield as well as manufacturing productivity is drastically improved.

The above-mentioned explanation has been made for the color filter disposition shown in FIG. 4 where R, G and Cy color filter elements repeatedly disposed. Replacement of the filter element order, for example, to R, Cy and G may be made, then the above explanation applies only by replacing those for the colors Cy and G each other.

The color of the filter elements are not limited to R, G and Cy, but any other combination is possible, when the chrominance signal is spatially modulated with the 120° phase difference. For example, color filter elements of complementary color to these primary colors may be used. Furthermore, though not very excellent on the aspect of color reproduction, a blue filter in place of the cyan filter in the above-mentioned example may be usable.

In the above-mentioned example, the picture elements of the horizontal lines are disposed in a manner that their spatial phases are shifted by 90° every lines of actually sequential scanning line. In the solid state imaging apparatus, the chrominance signals are produced based on the relative spatial phase relation between the horizontal disposition of color filter elements and horizontal disposition of picture elements. Accordingly, by disposing the picture elements in a manner that their horizontal spatial phases differ every horizontal lines, necessary two chrominance signals required to compose a composite color differential signal is obtainable therefrom. Accordingly, the phase shifting angles between the subsequently scanned horizontal lines are not necessarily limited to 90°, but other angles can be usable by suitably selecting the phase of the modulating axis for producing a modulated color difference signal from the chrominance signals.

Figure 7:
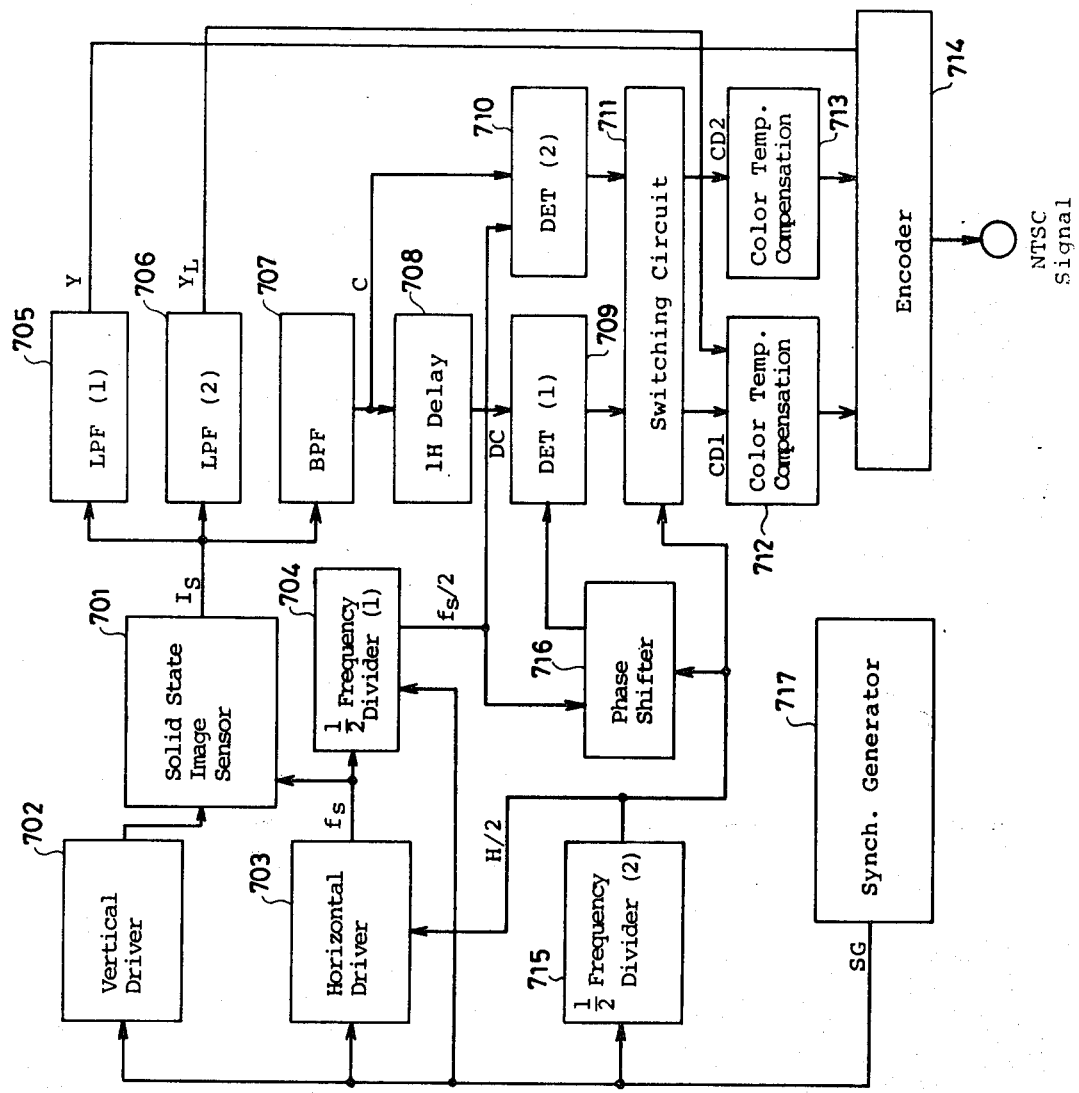
FIG. 7 is a block diagram of a signal processing circuit of the solid state color imaging apparatus of the embodiment of FIG. 4.

Next referring to FIG. 7, which is a block diagram of an example of a signal processing circuit for processing the output signal of the solid state imaging apparatus of FIG. 4.

Solid state image sensor 701 is driven by a vertical driver circuit 702 and a horizontal driver circuit 703 which are synchronized by horizontal and vertical synchronizing signals from a synchronizing signal generator (hereinafter synch. generator) 717, respectively, and issues output signal Is. The output signal Is is led through a first low-pass filter (hereinafter LPF(1)) 705 and results in to issue luminance signal Y. And the output signal Is is also led through a band-pass filter (hereinafter BPF) 707 and results in to issue a spatially modulated chrominance signal C. The chrominance signal C is detected by a synchronous detector (hereinafter DET(2)) 710 and results in producing a low band signal. Since the chrominance signal C is given in the form of difference of chrominance signal, the resultant detected signal becomes a color differential signal. That is, the chrominance signal is given in the form of color differential signal.

On the other hand the output signal of the BPF 707 is given to a 1H delay circuit 708, whose output is then given to another synchronous detector (i.e. demodulator) (DET(1)) 709.

The modulated color differential signal C comprises two color difference signals $$R - \frac{G + Cy}{2} \text{ and } \frac{\sqrt{3}}{2} (G - Cy)$$

which appear alternately every horizontal scanning. Therefore, at an instant during a horizontal scanning, at either one of the output signal (color differential signal) of the DET(1) 709 and the output signal of the DET(2) 710 is the first color differential signal $$R - \frac{G + Cy}{2}$$

and the output signal of the other one is the second color differential signal $$\frac{\sqrt{3}}{2} (G - Cy);$$

and in the next horizontal scanning the color differential signals are interchanged each other. These two output signals are led to the switching circuit 711 which changes over the output signals of DET(1) 709 and DET(2) 710 at every gap period between the horizontal scanning. By the interchanging switching action by the switching circuit 711, the first color differential signal CD1 of $$R - \frac{G + Cy}{2}$$

and the second color differential signal CD2 of $$\frac{\sqrt{3}}{2} (G - Cy)$$

are isolated and issued from a first output terminal CD1 and a second output terminal CD2, and they are given to a first color temperature compensation circuit 712 and a second color temperature compensation circuit 713, respectively. The color temperature compensation circuits 712 and 713 are known circuits for compensating the color temperature so as to become zero output when the objective image is white. The output signals of the first and the second color temperature compensation circuits are then given to an encoder 714. The encoder circuit 714 composes known NTSC video signal by utilizing color-compensated two color differential signals and the luminance signal Y from the LPF(1) 705.

In the composite signal formed by the above-mentioned process, the output signal is produced from the scanning lines which alternately changes spatial phase every scanning lines, since the spatial phases of disposition of the picture elements are shifted by 90° every scanning lines, with respect to the spatial phase of the frequency of a half ($\frac{1}{2}$) of the sampling frequency of the picture elements. Therefore, if such signal is used without spatial compensation for the phase shift every alternate horizontal scanning, the reproduced image therefrom will have zigzag image such that a straight vertical line will be deformed to a zigzag line by shifting of spatial position every horizontal scanning lines. In order to avoide such deformation of the image to be reproduced, a horizontal drive circuit 703 gives shifts of the starting points for every two horizontal scannings. By such shifts of the horizontal scannings, the composed NTSC video signal becomes free from the zigzag deformation due to the spatial shifts of the picture elements.

Reference signal, a signal of a frequency, which is $\frac{1}{2}$ of the horizontal driver output, to be given to the synch. DET(2) 710, is given from a first $\frac{1}{2}$ frequency divider 704, in synchronism to the horizontal scanning. That is, a signal of color filter repetition frequency in synchronism to the picture elements output signal is sent to the DET(2) 710.

Phase relation between the reference signal, modulated color differential signal C and delayed modulated color differential signal DC from the 1H Delay circuit 708 are shown in the following table.

TABLE

| Horizontal scanning | Phase of modulated color-differential signal C | Phase of reference signal to DET(2) | Phase of modulated color-differential signal DC | Phase difference between reference signal to DET(1) and reference signal to DET(2) |
|---|---|---|---|---|
| nH | 0 | 0 | 90° | +90° |
| (n + 1)H | 90° | 90° | 0 | −90° |
| (n + 2)H | 0 | 0 | 90° | +90° |
| (n + 3)H | 90° | 90° | 0 | −90° |
| . | | | | |
| . | | | | |

The reference signal obtained by the frequency divider 704 for DET(2) 710 can not be used for the reference signal for DET(1) 709 as it is, but must be shifted of the phase so as to coincide with the phase of modulated color differential signal DC in order to be used for DET(1) 709. The shift is made by a phase shifter 716. Instead of using such phase shifter, the similar function is obtainable by shifting the phase of the input carrier of DET(1) 709 or by shifting the phase of the output of the DET(1) 709.

Since the phase shifter 716, the horizontal driver 703 and the encoder 713 are all alternatingly switched every two horizontal scannings (that is the frequency of the switching of these circuits is $\frac{1}{2}$ of the frequency of the horizontal scaninnings), the synchronizing signal for the switching is given by dividing the horizontal scanning frequency by the $\frac{1}{2}$ frequency divider 715 which is synchronized by the synch, generator 717.

In the above-mentioned first example, spatial phase of the horizontal line of the picture elements is shifted by 90° every horizontal scanning line, in order to realize a mutual relation between the phase of disposition of the picture elements in the horizontal lines and the phase of disposition of the repetition of stripes of color filters, in such a manner tha the relation is changed for every horizontal lines which are scanned in sequence.

Figure 8:
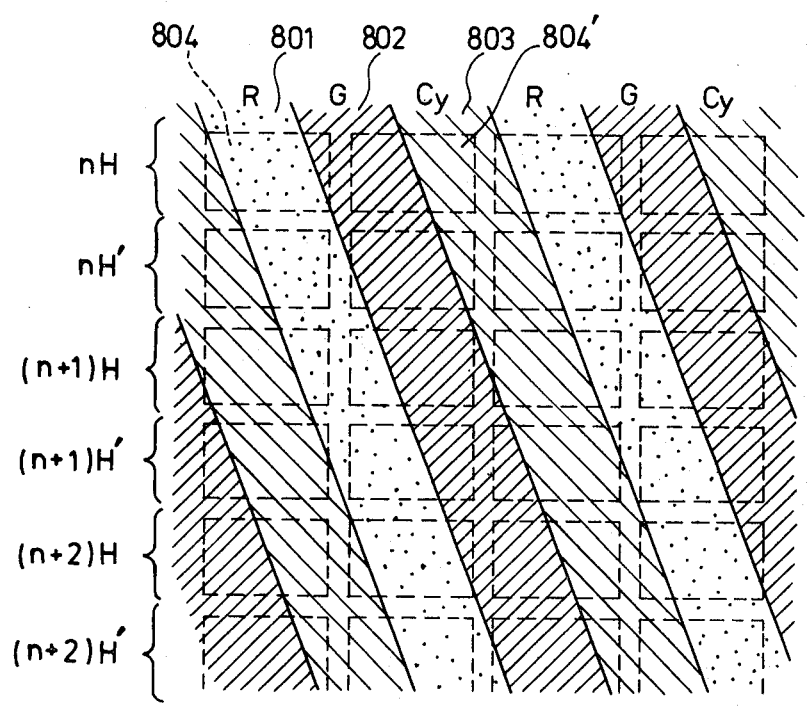
FIG. 8 is an enlarged front view showing a part of another solid state imaging apparatus embodying the present invention.

In order to realize the above-mentioned mutual relationship, instead of the shifting of spatial phase of the horizontal line of picture elements, the other one, namely, the spatial phase of the filter elements may be shifted relative to that of the picture elements. FIG. 8 shows such latter example of shifting the spatial phase of the filter elements with respect to the picture elements in the horizontal lines. As shown in FIG. 8, the stripe shaped color filter comprises red filter elements 801, green filter elements 802 and cyan filter elements 803 forming parallel oblique stripes thereof repeating in the order. The parallel oblique stripes are disposed in such angle that the spatial phase relations with respect to the picture elements in horizontal line are shifted between the n−th horizontal line and (n+1)−th horizontal line by 90°, and also by 90° between the (n+1)−th and (n+2)−th. The spatial repetition frequency $f_f$ of the filter elements on a horizontal line is half the spatial frequency $f_p$ of the dispositions of the picture elements in horizontal lines, that is $f_f=0.5f_p$.

As a result of the above-mentioned construction of the relation between the filter elements and the picture elements, for n−th line, the chrominance signal is produced as illustrated in FIGS. 9(A) to 9(E). FIG. 9(A) shows order of dispositions of color filter element stripes of red, green and cyan colors. FIG. 9(B) shows relative light amount of red light, green light and cyan light emanating through the color filter elements of respective colors onto the solid state image, sensor under a premise that contents and amount of incident white light is uniform. The three lights are spatially disposed with phase differences of 120° between each other. FIG. 5(C) shows distribution of sensitivities of the solid state image sensor, represented as an amount of [signal value/light amount]. FIG. 9(D) schematically shows level and spatial phases of the chrominance signals $E_R$, $E_G$ and $E_{Cy}$ for red, green and cyan colors in a way such that the height of the vertical arrows show value of output chrominance signal designated in the chart, position of the arrows represent center of spatial distribution of the chrominance signal, and oblique lines connecting the arrow tops showing the change of the values for red signal (by solid lines), green signal (by dotted lines) and cyan signal (by chain lines).

The spatial phase relations of the color filter elements against the picture elements in horizontal lines are indicated by $\theta_R$, $\theta_G$ and $\theta_{Cy}$ for red, green and cyan color filter elements. As has been stated, the three color filter elements are disposed in spatial phase differences of 120° each other, and therefore, when the $\theta_R$ is selected as $\theta_R=\theta_O$, other phases are represented as $\theta_G=\theta-\frac{2}{3}\pi$, $\theta_{Cy}=\theta+\frac{2}{3}\pi$. FIG. 5(D) shows the case where $\theta_O=0°$ Signal $P_1$ issued by the first picture element 804 and signal $P_2$ issued by the second picture element 804' on the n−th horizontal line of the picture elements are, taken account of areas of the respective color filter elements covering the picture elements 804 and 804', represented as follows:

$$P_1 = E_R + \tfrac{1}{4}E_G + \tfrac{1}{4}E_{Cy} \atop P_2 = \tfrac{3}{4}E_G + \tfrac{3}{4}E_{Cy}\Bigg\} . \quad (15)$$

For the picture elements disposed on the right hand of the picture elements 804' and subsequent, the above signals appear repeatingly.

Therefore, by scanning the n−th horizontal line the following signal $S_n$ is produced for the n−th horizontal line as a function of time t:

$$S_n = \frac{E_R}{2}(1 + \cos\omega t) + \frac{E_G}{2}(1 - \tfrac{1}{2}\cos\omega t) + \quad (16)$$

$$\frac{E_{Cy}}{2}(1 - \tfrac{1}{2}\cos\omega t)$$

$$= \tfrac{1}{2}(E_R + E_G + E_{Cy}) + \left(E_R - \frac{E_G}{2} - \frac{E_{Cy}}{2}\right)\cos\omega t.$$

From the above equation (16), it is understood that the picture element output signal contains, in the fundamental component thereof, a luminance signal part ($E_R+E_G+E_{Cy}$) and a chrominance signal part $$\left(E_R - \frac{E_G}{2} - \frac{E_{Cy}}{2}\right).$$

The above-mentioned explanation has been for the case of $\theta=0$, but, in general, the situation is as follows:

The spatial and spectral light distribution of light produced by the color filter elements can be represented as follows:

$$L(x) = R\{a_0 + a_1\cos(\omega X + \theta)\} + G\{a_0 + a_1\cos(\omega X + \quad (17)$$

$$\theta - \tfrac{2}{3}\pi)\} + Cy\{a_0 + a_1\cos(\omega X + \theta + \tfrac{2}{3}\pi)\}$$

$$= a_0(R + G + Cy) + a_1\{R\cos(\omega X + \theta) + G\cos(\omega X +$$

$$\theta - \tfrac{2}{3}\pi) + Cy\cos(\omega X + \theta + \tfrac{2}{3}\pi)\}.$$

hereafter, for the sake of simplicity of explanation, let us provide that the constants $a_0$ and $a_1$ in the above-mentioned equation (17) are $a_0=a_1=1$. Then, the above-mentioned spatial distribution becomes:

$$L(x)=(R+G+Cy)+\{R\cos(\omega X+\theta)+G\cos(\omega X+\theta\tfrac{2}{3}\pi)+Cy\cos(\omega X+\theta+\tfrac{2}{3}\pi)\} \quad (18).$$

As a result of emanation by the above-mentioned light $L(x)$, the electric output signal S of the solid state image sensor when scanning the line at a certain speed is given as:

$$S=\tfrac{1}{2}(E_R+E_G+E_{Cy})+\tfrac{1}{2}\{E_R\cos\theta+E_G\cos(\theta-\tfrac{2}{3}\pi)+E_{Cy}\cos(\theta+\tfrac{2}{3}\pi)\}\cos\omega t \quad (19).$$

Since the spatial interrelation between the color filter element disposition and the picture element disposition in every horizontal scanning lines is shifted by 90° every actual scanning lines, when the phase difference $\theta$ in nH(n−th horizontal line) is $\theta=0$, the phase difference of (n+1)H ((n+1)−th horizontal line) is 90°, that for nH'(n−th horizontal line in the next field) is 45° and that for (n+1)H' (n+1)−th horizontal line in said next field) is 135°.

Figure 10:
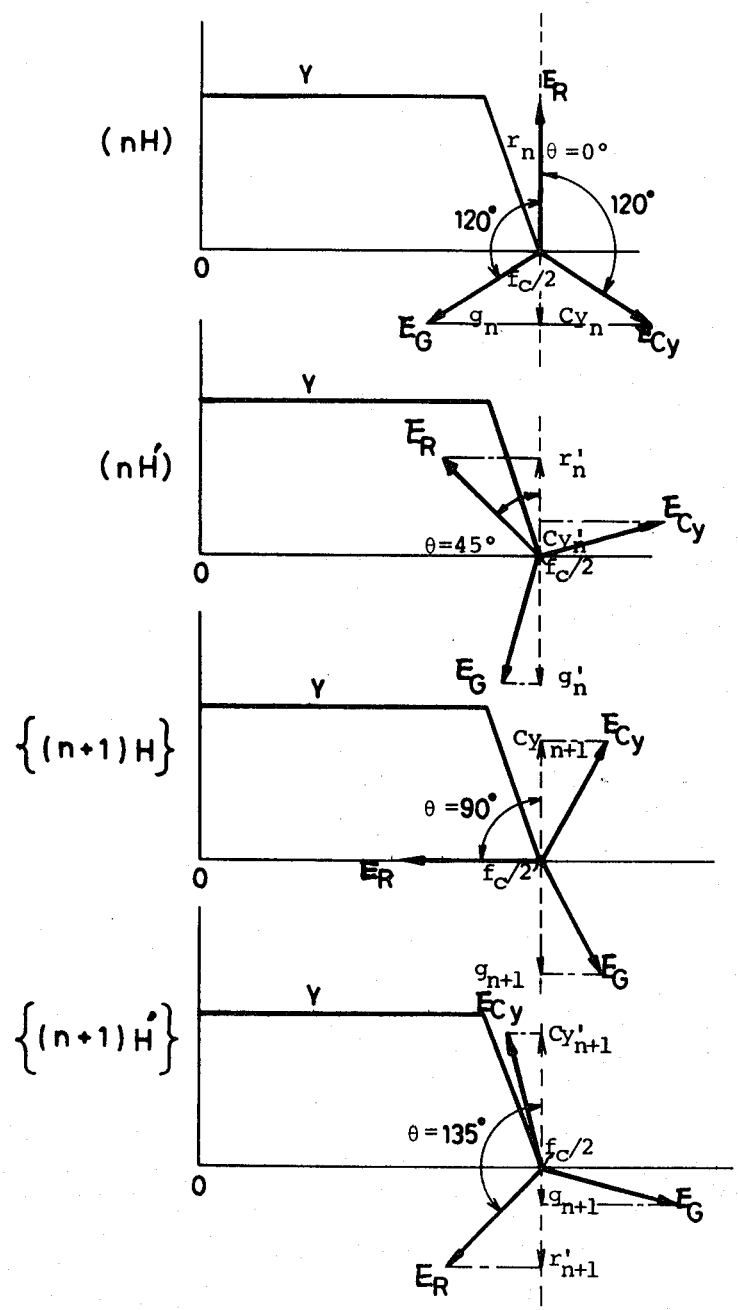
FIG. 10 is a diagram showing relation between frequency spectrum of the luminance signal and phase of the carrier of the chrominance signal for various horizontal lines.

Furthermore, by the similar rule, the phase difference in the (n+2)H ((n+2)—th horizontal line) is 180°, (n+3)H ((n+3)—th horizontal line in) is 270°, and so on . . . ; and in the phase difference of 180° to 360°, the signal becomes a repetition with inverse polarity to the signal of 0° to 180°, and accordingly the elucidation will be made only for the phase differences of 0° to 180° inclusive. Under the providing, the signals output from the horizontal lines are those having $\theta$ of 0° (for nH line), 45° (for nH' line), 90° (for (n+1)H' line) and 135° (for (n+1)H' line. FIG. 10 is a diagram showing a relation between the spectral distribution of the luminance signal Y and phase difference of the carrier of the chrominance signals $E_R$, $E_G$ and $E_{Cy}$, for the above-mentioned various $\theta$-angles. In the diagrams of FIG. 10, for the curve Y representing the spectral distribution of the luminance signal, the ordinate indicates relative level and the abscissa indicates frequency, and the arrows $E_R$, $E_G$ and $E_{Cy}$, which represent spatial phase of the color filter elements, and arrows $r_n$, $g_n$, $cy_n$, $r'_n$, $g'_n$, $cy'_n$, $r'_{n+1}$, $g'_{n+1}$ and $cy'_{n+1}$, which are electric signal components contained in the modulated signals from the image sensor and based on the lights emanating through the color filters $E_R$, $E_G$ and $E_{Cy}$, the horizontal axes indicate 0° reference line. In FIG. 10, the points $f_c$ represent carrier frequency of the chrominance signal. As has been elucidated, the fundamental wave part of the output signal of the picture elements becomes the signal of sum of the signals $E_R$, $E_G$ and $E_{Cy}$ which are based on the lights emanated thereon through respective color filter elements, and accordingly, the fundamental wave part can be used as the luminance signal.

As has been shown by the equation (19), the luminance part or the first term $E_R + E_G + E_{Cy}$ is free from the phase difference $\theta_1$, and in principle, the luminance signals are uniform when the same white uniform light emanate the apparatus. In case of ordinary objective image of low color purity, where the sampling is made in all the picture elements of horizontal lines, the luminance signal has a broad band width reaching to half of the sampling frequency.

In the modulated chrominance signal, as can be understood from the equation (19) the carrier appears at a frequency half the sampling frequency of the picture elements, and accordingly, the modulated chrominance signal appears as follows with respect to the spatial phase difference $\theta$ between the picture elements and the color filter elements.

For example, the modulated color chrominance signal is represent by (nH) of FIG. 10, when the phase difference $\theta = 0$, and the value of the respective chrominance signals $r_n$, $g_n$ and $cy_n$ are obtained as values defined by projecting with a horizontal lines (chain lines) from the tops of vector arrows $E_R$, $E_G$ and $E_{Cy}$ perpendicularly to the dotted vertical line which represent phase of the picture elements disposition. Values of the modulated color differential signal in FIG. 10 (nH) become $r_n - g_n - cy_n$, that is:

$$\{E_R + E_G \cos(-\tfrac{2}{3}\pi) + E_{Cy} \cos(\tfrac{2}{3}\pi)\},$$

which coincides with the aforementioned explanation by equation (19).

In the similar way the modulated color differential signals for other horizontal line is as follows:
for nH' line . . . $r'_n + cy'_n - g'_n$
for (n+1)H line . . . $cy_{n+1} - g_{n+1}$
for (n+1)H line . . . $cy'_{n+1} - g'_{n+1} - r'_{n+1}$ As shown above, different modulated color differential signal is obtainable from respective horizontal scanning lines, and these signals are obtained in the form of color differential signals.

Figure 11:
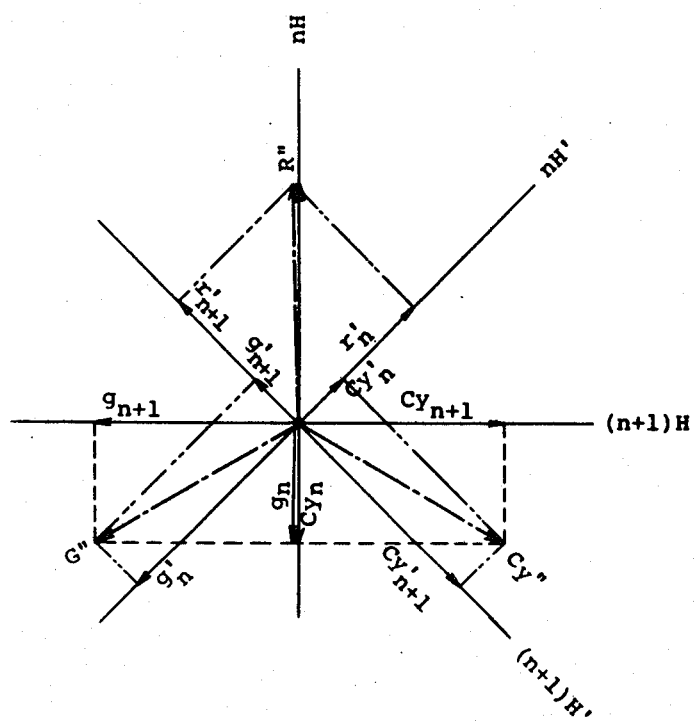
FIG. 11 is a vector diagram representing phases of three chrominance signals of the embodiment.

The modulated color differential signal obtained in the above-mentioned forms are obtained by synchronous demodulation by using reference signals of respective phases corresponding to the horizontal scanning lines shown in FIG. 11, so that the chrominance signals $E_R$, $E_G$ and $E_{Cy}$ with 120° phase difference each other is produced. The demodulation is made by using reference signal of a phase represented by the direction of nH of FIG. 11 for modulated color differential signal of nH scanning line, and by using reference signal of a phase represented by the direction of (n+1) H for modulated color differential signal of (n+1)H. The phase of nH direction and (n+1)H direction have right angle between each other, and a signal of $(r_n - g_n - c_n)$ is produced by the demodulation by using the reference signal of nH phase shown in FIG. 11, and another signal $(cy_{n+1} - g_{n+1})$ is produced by the demodulation by using the reference signal of (n+1)H phase shown in FIG. 11. The demodulated signal based on the light from the red filter is determined by $r_n$ and is reproduced at the position of R". Similarly, demodulated signal based on the light from the green filter is determined by $g_n$ and $g_{n+1}$ and reproduced at the position of G"; and demodulated signal based on the light from the cyan filter is determined by $cy_n$ and $cy_{n+1}$ and reproduced at the position of Cy". In the similar way, for the modulated color differential signal in the nH' line (n—th horizontal scanning in the next field), the demodulation can be made by using the reference signal of nH' phase shown in FIG. 11, for reproducing the signals of R", G" and Cy"; and for the modulated color differential signal in the (n+1)H' line ((n+1)—th horizontal scanning in said next field), the demodulation can be made by using (n+1)H' phase shown in FIG. 11 to reproduce the signals R", G" and Cy".

In summarizing the example of the construction of FIG. 8, as shown by FIG. 10, the solid state image sensor issues a luminance signal, having a band width of half of the frequency of sampling of the picture elements, and two kinds of modulated color differential signals alternatingly every horizontal scanning. The two kinds of the modulated color differential signals become inversed of their polarity every two horizontal scannings. The modulation phase of the modulated color differential signals shifts by 45° every fields. Therefore, by changing the polarity of the above-mentioned two modulated color differential signals every two horizontal scannings, delaying the modulated color signals for one horizontal scanning period respectively and interpolating the modulated color signals with the delayed same kind signals to produce two kind of continuous modulated signals, and by shifting the phase of the reference signal of the demodulator by 45° every field, then the luminance signal having the theoretical resolution determined by the number of picture elements, as well as two color differential signals are obtainable.

In the example, even when the color filter makes misregistration of horizontal or vertical slip to the picture elements, the video signal can be rightly produced as follows:

When the registration is lost, the spatial phase relation is changed due to the slip from the designed spatial relation. Accordingly, as can be seen from the foregoing elucidation, the phase change modifies the modulated color differential signals. Then, by shifting the phase of the whole phases of reference signal of the demodulator shown in FIG. 11 responding to the amount of the phase shift, the demodulated vectors R", G" and Cy" of primary colors can be obtainable at the right position. Therefore, as a conclusion, there is fundamentally no need to align the color filters and solid state image sensors in vertical and horizontal directions.

In the actual solid state imaging apparatus, gap spaces around the picture element has a certain size, and excessive in-uniformity of the picture element sizes causes in-uniformity of the luminance signal. However, in actual solid state imaging sensors, where the horizontal gaps between the picture elements are designed narrow, or where the horizontal gaps are negligibly small by adoption of photoconductive films accumulation, effects of such gaps are negligibly small.

Figure 12:
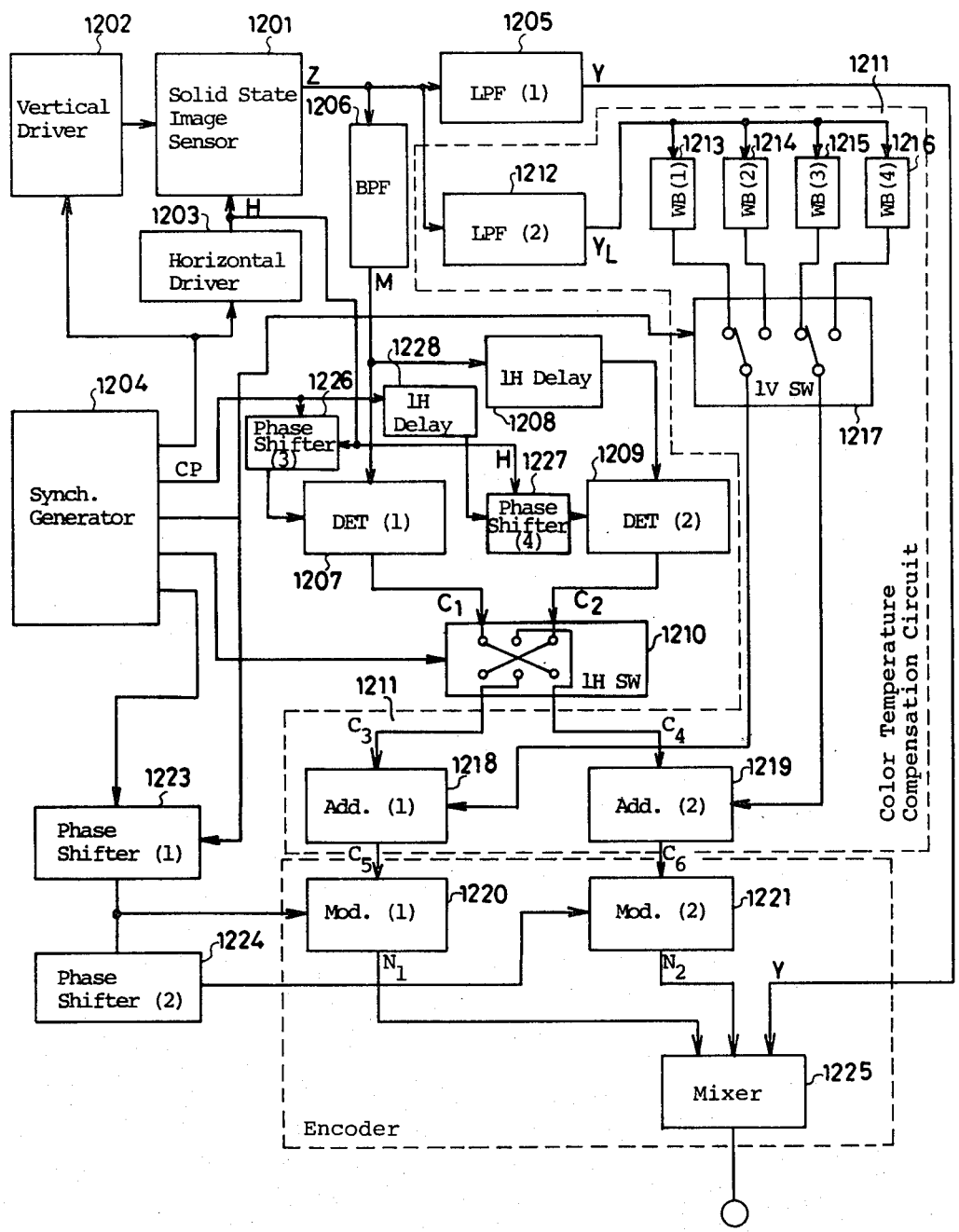
FIG. 12 is a circuit block diagram of a signal processing circuit of the solid state color imaging apparatus of the embodiment of FIG. 8.

FIG. 12 is a block diagram of an example circuit for processing output signal of the solid state image sensor of FIG. 8. In the circuit of FIG. 12, a solid state image sensor 1201 is driven by a vertical driver 1202 and a horizontal driver 1203, which is synchronized by a synch. generator 1804, and issues output signal Z which is synchronized by the horizontal and the vertical synchronizing signal. The sensor output signal is led through a low-pass filter (LPF(1) 1205 having a cut-off frequency half of the frequency of the sampling of the picture elements (usually identical to the horizontal driving frequency), and issue the luminance signal thereby. On the other hand the same sensor output signal Z is led through a band-pass filter (BPF) 1206 to issue the modulated color-differential signal thereby. The output modulated color-differential signal M is then demodulated by a first synchronous detector (DET(1)) 1207 by using output signal H from a horizontal driver 1203 and passed through a third phase shifter (3) 1225 as reference signal, thereby producing a color differential signal $C_1$. On the other hand, another reference signal is led from a synch. generator 1204 through a one-horizontal-scanning-time delay circuit (1H Delay) 1228 and through a fourth phase shifter (4) 1227 to a second synchronous detector (DET(2)) 1209. Thereby, the outputs $C_1$ and $C_2$ of the demodulators 1207 and 1209 change their phases every two horizontal scannings, and is aligned of their phase inversions of color differential signals occurring every two horizontal scanning lines. Control signal $C_p$ to be applied to the fourth phase shifter (4) 1227 has a phase lag of one horizontal scanning line from that applied to the phase shifter (3) 1226, as a result of its passing through the 1H delay circuit 1228, in order to meat the time difference between the modulated color differential signals to be given to the demodulators DET(1) 1207 and DET(2) 1209. On the other hand, modulated color difference signal M is led through a one-horizontal-scanning-period delay circuit (1H Delay) 1208 and fed to the synchronous detector (DET(2)) 1209 to produce color difference signal $C_2$, which is the signal equivalent to but lags by one horizontal scanning period from the other color differential signal $C_1$.

The color differential signals comprise a pair of color differential signals appearing alternately for every horizontal scanning period (for example, $E_R-0.5(E_G+E_{Cy})$ and $0.75(E_{Cy}-E_G)$ in the first field, as well as, $0.71E_R+0.26E_{Cy}-0.97E_G$ and $0.97E_{Cy}-0.71E_R-0.26E_G$ in the second field in the case of FIG. 10, and accordingly, by changing over these signals by a switching circuit 1210 (which changes over every horizontal line periods) continuous two color differential signals $C_3$ and $C_4$ are produced. (For example, the color differential signal $C_3$ is $E_R-0.5(E_G+E_{Cy})$ or $0.71E_R+0.71E_R+0.26E_{Cy}-0.97E_G$ and the other color differential signal $C_4$ is $0.7(E_{Cy}-E_G)$ or $0.97E_{Cy}-0.71E_R-0.26E_G$.)

The two color differential signals are lead through a color-temperature-compensation circuit 1211, the color-compensated outputs $C_5$ and $C_6$ from the circuit 1211 is modulated by a first modulator (MOD(1)) 1220 and a second modulator (MOD(2)) 1221, respectively, and further, the modulated signals are led to a mixer 1225, wherein an NTSC video signal is composed. Hereupon, the color differential signals $C_5$ and $C_6$ to be given to the modulator 1220 and 1221 are the color differential signals which change every field, and in one field the two color differential signal therein $C_5$ and $C_6$ have two modulation signals having phases different by 90° from each other. In order to align the phase difference, the phases are shifted by the phase shifter (2) 1224 by 90° after every field and led to the modulators 1220. Further, the phases of the modulated signals are shifted by the other phase shifter (1) 1223 by 45° after every field and led to the modulator (1). By the above-mentioned phase compensations, the phases of the outputs of every fields includes in the composed NTSC signal are made substantially uniform. In other words, differences between modulated color difference signals of respective fields are substantially eliminated, by means of setting different phases of modulation signals for diffeent modulated color differential signals $C_5$ and $C_6$ of respective fields.

The above-mentioned color-temperature compensation circuit 1211 modifies luminance signal $Y_L$ prepared in a color temperature compensation circuit 1211, wherein the signal Z is led through a second low pass filter LPF(2) 1212 in order to give the same bandwidth to the modulated color differential signal, to produce the modulated color differential signals $C_3$ and $C_4$. Hereupon, the modulated color difference signals $C_3$ and $C_4$ are those alternately changes each other every field. Accordingly, the signal $Y_L$ is changed to color-temperature-compensated signals actually to be added to the modulated color differential signals $C_3$ and $C_4$ having respective phases of modulation signals of respective fields. This is done by leading the signal $Y_L$ to the gain control circuits WB(1) 1213, WB(2) 1214, WB(3) 1215, and WB(4) 1216 and further to the change over switching circuit (1H SW) 1210 which switches after every horizontal scannings, and to the adders (ADD(1) 1218 and (ADD(2)) 1219. The gain control circuits are those gains thereof can be adjusted from a small value, lower than 1 to a large value, higher than 1 and polarity thereof can be also changeable.

As has been elucidated referring to FIG. 8 through FIG. 12, the output signal of the solid state image sensor emanated through oblique-stripes color filter elements is processed by the circuit of FIG. 12, and can produce ordinary NTSC video signal.

Figure 13:
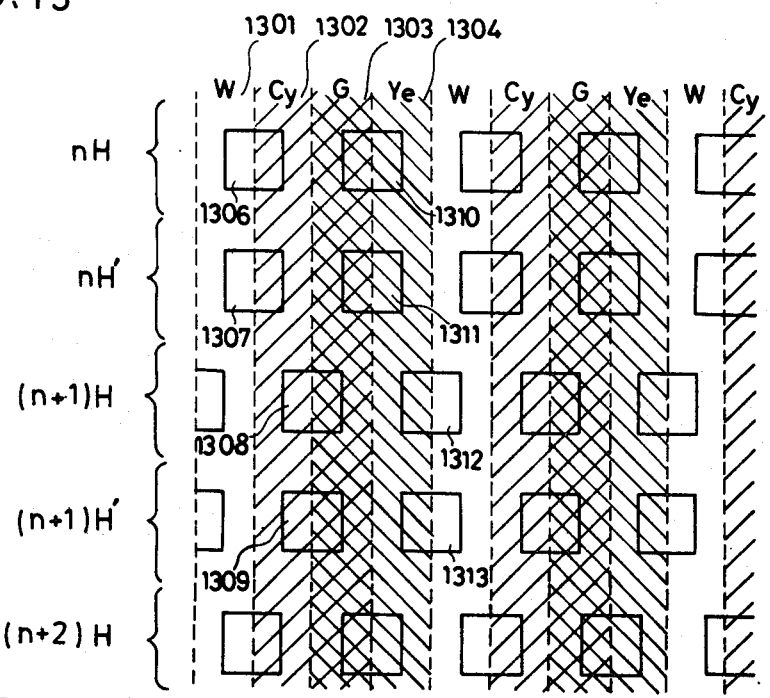
FIG. 13 is an enlarged front view showing a part of still another solid state imaging apparatus embodying the present invention.
Figure 14:
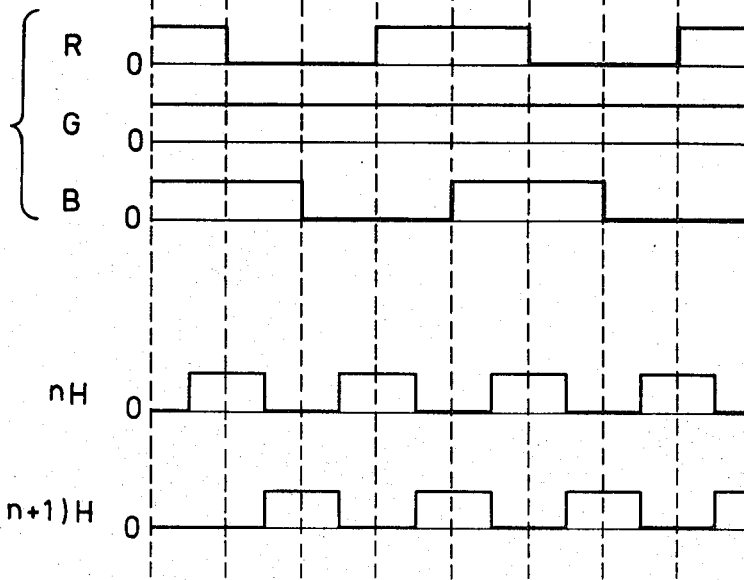
FIG. 14 is a chart of the embodiment showing spatial relation among disposition of color filter elements, relative light amounts picture elements.

Another example utilizing complementary colors stripe filters on the mosaic-disposed picture elements on a solid state image sensor is elucidated referring to FIGS. 13 to 15.

FIG. 13 shows such example wherein spatial phases of the picture elements in horizontal lines are shifted alternately after every two lines.

In FIG. 13, the filter comprises vertical stripes of white (W) (or transparent) filter elements 1301 which passes substantially all spectral component of light, cyan (Cy) filter elements 1302 which stops red light component, green (G) filter elements 1303 which passes green light component and yellow (Ye) filter elements 1304 which stops blue light component in repeating order.

The solid state image sensor covered thereby comprises a number of mosaic-disposed picture elements 1306, 1307, 1308, 1309, 1310, 1311, 1312, 1313, .... The picture elements 1306 and 1310 are in the nH scanning line which is n-th scanning line in the first horizontal field. The picture elements 1307 and 1311 are in the nH' scanning line which is n-th horizontal scanning line in the second field. The picture elements 1308 and 1312 are in the (n+1)H scanning line which is (n+1)-th horizontal scanning line in the first field. The picture elements 1309 and 1313 are in the (n+1)H' scanning line which is (n+1)-th horizontal scanning line in the second field. The spatial phases of the disposition of the picture elements in the horizontal lines are repeatingly shifted by 90° every horizontal lines of sequential scanning. That is, for the example apparatus, which is for use in ordinary interlace video signal, the spatial phases are shifted 90° for every two horizontal lines as shown in FIG. 13. In FIG. 13, the lines nH, (n+1)H, (n+2)H ... designate horizontal lines to be scanned in the first field, and nH', (n'1)H', (n+2)H' ... designate horizontal lines to be scanned in the second field. Therefore, in actual interlace scannings, the spatial phase of the disposition of scanned picture element shifts every scanning by 90°.

The relation between a spatial frequency $f_p$ of the repetition of the picture elements in the horizontal lines and spatial frequency $f_f$ of the repetition of the stripe shaped color filter elements of the color filter is set in a relation of:

$$f_f = 0.5 f_p \quad (20).$$

That is a set of four kinds of color filter element stripes are disposed on a horizontal spatial period (i.e., length) of two picture elements, as shown in FIG. 13. Accordingly, the spatial frequency of a color (for example, red) represented as spatial modulation of the output signal of the picture elements of the horizontal line is ½ of the spatial frequency of sampling by the picture elements. In other words, the spatial period (length of one repetition) of a color represented as the spatial modulation of the output chrominance signal of the picture elements of the horizontal line is two times as long as the spatial period of sampling by the picture elements.

FIG. 14 shows how the output signals of the solid state imaging apparatus of FIG. 13 is and its resultant signals.

FIG. 14(A) shows order of dispositions of color filter element stripes of white, cyan, green and yellow colors. FIG. 14(B) shows relative light amount of red light, green light and blue light emanating through the color filter elements onto the solid state image sensor under a premise that contents and amount of incident white light is uniform. For example, red light passes white filter elements and yellow filter elements and is stopped by the cyan filter elements and green filter elements. Therefore, the distribution of the red light under the color filter elements becomes as shown in FIG. 14(B), R, that is the spatial frequency of the red light is half the spatial frequency of the picture element disposition, and the duty of the signal based on the red light becomes 50%. Green light passes all the color filter elment of the above-mentioned filter and blue light shows similar spatial distribution to that of the red light, but lagging from that of red light by 90°. Under the above-mentioned condition, the output signals $S_{406}$, $S_{410}$, $S_{408}$ and $S_{412}$ issued from the picture elements 406, 410, 408 and 412, respectively are as follows:

$$\left. \begin{array}{l} S_{406} = \tfrac{1}{2}\overline{R} + \overline{G} + \overline{B} \\ S_{410} = \tfrac{1}{2}\overline{R} + \overline{G} \\ S_{408} = \overline{G} + \tfrac{1}{2}\overline{B} \\ S_{412} = \overline{R} + \overline{G} + \tfrac{1}{2}\overline{B} \end{array} \right\} \quad (21)$$

Therefore, the output signal $S_{nH}$ produced by nH (n−th horizontal scanning in the first field) is given as follows:

$$S_{nH} = S_{406} + S_{410} + (S_{406} - S_{410})\sin\omega t \quad (22)$$
$$= (\overline{R} + 2\overline{G} + \overline{B}) + \overline{B}\sin\omega t.$$

In the same manner the output signal $S_{(n+1)H}$ produced by (n+1)H ((n+1)-th horizontal scanning in the first field) is given as follows:

$$S_{(n+1)H} = S_{408} + S_{412} + (S_{408} - S_{412})\sin\omega t \quad (23)$$
$$= (\overline{R} + 2\overline{G} + \overline{B}) + \overline{R}\sin\left(\omega t + \frac{\pi}{2}\right).$$

As is shown in the equation (23), the output signal from the solid state imaging signal has a low frequency component $(\overline{R} + 2\overline{G} + \overline{B})$, to which $$\overline{R}\sin\left(\omega t + \frac{\pi}{2}\right)$$

or $\overline{B} \sin\omega t$ alternately are superposed depending on the order of horizontal scanning of n−th (wherein the added signal is $\overline{B} \sin\omega t$) or (n+1)−th (wherein the added signal is $$\overline{R}\sin\left(\omega t + \frac{\pi}{2}\right) \text{ )}$$

line. In other words, by passing the sensor output signal through a low pass filter a luminance signal is produced, and by isolating the modulated chrominance signals, red and blue chrominance signal is produced in alternate horizontal scannings; and by processing and composing these signals, NTSC video signal is obtainable.

In the case of a solid state color imaging apparatus using stripe-shaped filter having stripe shaped color filter elements, the relation between the spatial dispositions of solid state image sensor and the spatial distribution of the color filter elements is as follows:

When the registration between the color filter elements and the picture elements shifts in the vertical direction, there is no problem since the color filter has vertical stripes only.

When the registration between the color filter elements and the picture elements shift in the horizontal direction, since the duties of the spatially modulated chrominance signals are 50% and the filter element's spatial frequency is half of the picture element's spatial frequency, low frequency component of the output signal is unchanged irrespective of the horizontal registration. In this horizontal shift, the spatially modulated chrominance signal components are considered as follows.

Figure 15A:
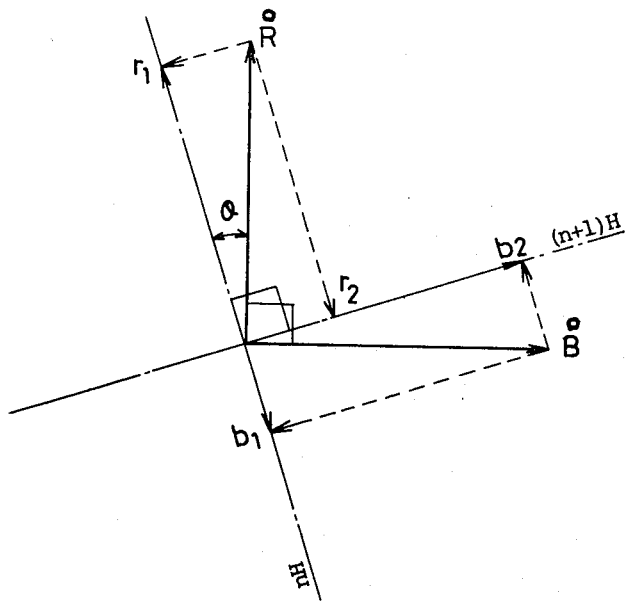
FIGS. 15A and 15B are vector diagrams representing phases of chrominance signals of the embodiment.

As shown by FIG. 15(A), the spatially modulated red signal R and blue signal B have phases different by 90° to each other. And, the phases of the picture elements of n−th horizontal line and (n+1)−th horizontal line have 90° angle inbetween. Therefore, the shift angle $\theta$ between the color filter elements and the picture elements is compensated by a rotation of the phase of modulation signal as shown in FIG. 15(B).

Figure 15B:
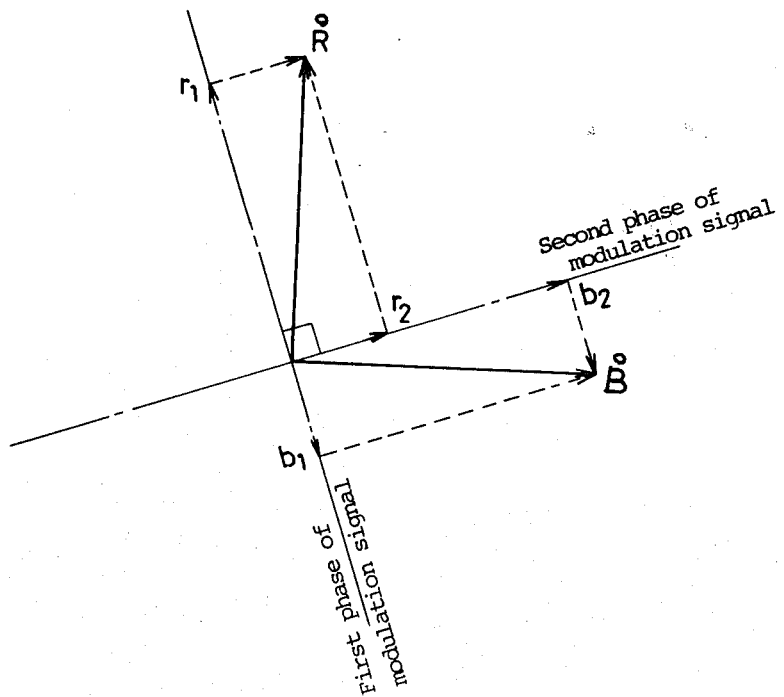

For example, when an objective image having a color of a phase shown by RÅ vector, the vector RÅ shown in FIG. 15(A) has the signal value $r_1$ and $r_2$ for the nH and (n+1)H scannings, the corresponding original vector RÅ can be found by selecting the phase of the modulation signal for modulation as shown in FIG. 15(B). As elucidated above, the spatial relation between the color filter elements and the picture elements can be freely shifted, or in other words, there is no need of paying hard effort in registration in the mass production.

The processing of the output signal of this example can be made, in principle, by means of the signal processing circuit of FIG. 7. In this case, the chrominance signals obtained from the synchronous demodulators DET(1) and DET(2) are red chrominance signal and blue chrominance signal. Therefore, the outputs CD1 and CD2 are primary color signals. Therefore, by reducing the component of luminance signal to the encoder 714 by passing through the color temperature compensation circuits (1) (2), a pair of color differential signals $R-Y_L$ and $B-Y_L$ are produced, and NTSC signal is produced by the encoder (714).

Figure 16:
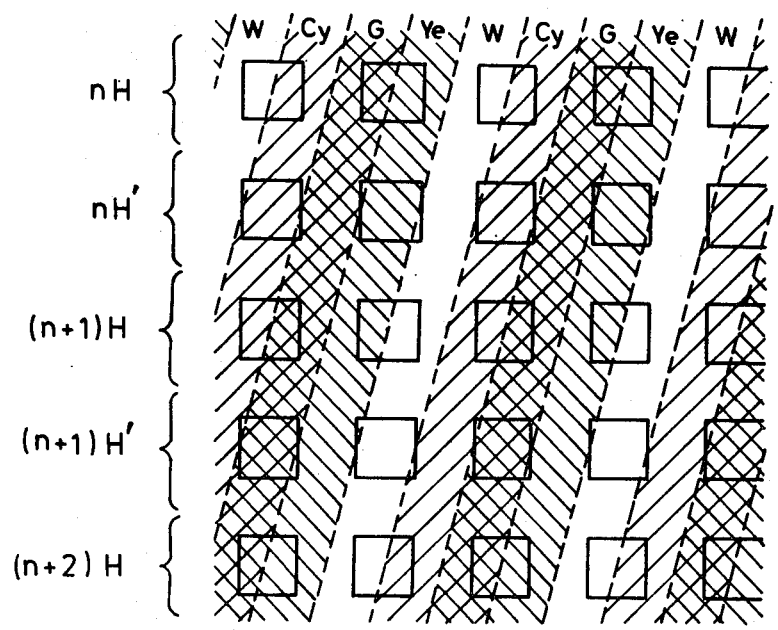
FIG. 16 is an enlarged front view showing a part of still another solid state imaging apparatus embodying the present invention.

Oblique stripe filters as elucidated in the example of FIG. 8 is applicable also to this example. FIG. 16 shows such example which comprises stripes of repetition of four color elements filters W, Cy, G and Ye. The circuit shown in FIG. 12 is fundamentally usable.

The present invention is applicable also for such exaple using a filter having repetition of filter element stripes of Cy, Mg and R which are complementary colors of R, G and Cy of FIG. 4 or FIG. 8.

What is claimed is:

1. A solid state color imaging apparatus comprising:
   a solid state image sensor comprising a plurality of picture elements regularly disposed in two dimensional patterns, the disposition comprising a plurality of horizontal lines, each having a plurality of picture elements disposed in repetition at a predetermined pitch,
   a color filter comprising a plurality of substantially parallel stripes of color filter elements, said row having repetition of stripes of a predetermined number of color filter elements,
   characterized in that
   spatial relations between the phases of repetition of the picture elements in the horizontal lines and the phases of repetition of stripes of the color filters are changed for different horizontal lines which are scanned in sequence, wherein said phases of the repetition of the picture elements in the horizontal lines are changed for every horizontal lines which are scanned in sequence, and
   wherein said change of phase per one horizontal line is substantially 90°.

2. A solid state color imaging apparatus in accordance with claim 1, wherein
   said phases of repetition of the stripes of the color filter element in the horizontal lines are changed for every horizontal lines which are scanned in sequence by disposing said stripes of the color filter elements oblique to said horizontal lines.

3. A solid state color imaging apparatus in accordance with claim 1, wherein
   spatial frequency $f_p$ of said repetition of the picture elements and spatial frequency $f_f$ of said repetition of the color filter elements has a relation of $f_f = \frac{1}{2} f_p$.

4. A solid state color imaging apparatus in accordance with claim 1, wherein
   said color filter comprises stripes of color filter elements of red color for passing red light, green color for passing green light and cyan color for passing lights other than red light.

5. A solid state color imaging apparatus in accordance with claim 1, wherein
   said color filter comprises stripes of color filter elements of transparent or translucent for passing lights of all colors, cyan color for passing lights other than red light, green color for passing light of green color, yellow color for passing lights other than blue light.

6. A solid state color imaging apparatus comprising:
   a solid state image sensor comprising a plurality of picture elements regularly disposed in two dimensional patterns, the disposition comprising a plurality of horizontal lines, each having a plurality of picture elements disposed in repetition at a predetermined pitch,
   a color filter comprising a plurality of substantially parallel stripes of color filter elements, said row having repetition of stripes of a predetermined number of color filter elements,
   characterized in that
   spatial relations between the phases of repetition of the picture elements in the horizontal lines and the phases of repetition of stripes of the color filters are changed for different horizontal lines which are scanned in sequence,
   and spatial frequency $f_p$ of said repetition of the picture elements and spatial frequency $f_f$ of said repetition of the color filter elements has a relation of $f_f = \frac{1}{2} f_p$.

7. A solid state color imaging apparatus in accordance with claim 6, wherein
   said color filter comprises stripes of color filter elements of red color for passing red light, green color for passing green light and cyan color for passing lights other than red light.

8. A solid state color imaging apparatus in accordance with claim 6, wherein
   said color filter comprises stripes of color filter elements of transparent or translucent for passing lights of all colors, cyan color for passing lights other than red light, green color for passing light of green color, yellow color for passing lights other than blue lights.

9. A solid state color imaging apparatus in accordance with claim 6, wherein
said phases of the repetition of the picture elements in the horizontal lines are changed for different horizontal lines which are scanned in sequence.

10. A solid state color imaging apparatus in accordance with claim 9, wherein
said color filter comprises stripes of color filter elements of red color for passing red light, green color for passing green light and cyan color for passing lights other than red light.

11. A solid state color imaging apparatus in accordance with claim 9, wherein
said color filter comprises stripes of color filter elements of transparent of translucent for passing lights of all colors, cyan color for passing lights other than red lights, green color for passing light of green color, yellow color for passing lights other than blue light.

12. A solid state color imaging apparatus in accordance with claim 6, wherein
said phases of repetition of the stripes of the color filter element in the horizontal lines are changed for every horizontal lines which are scanned in sequence by disposing said stripes of the color filter elements oblique to said horizontal lines.

13. A solid state color imaging apparatus in accordance with claim 12, wherein
said color filter comprises stripes of color filter elements of red color for passing redlight, green color for passing green light and cyan color for passing lights other than red light.

14. A solid state color imaging apparatus in accordance with claim 12, wherein
said color filter comprises stripes of color filter elements of transparent or translucent for passing lights of all colors, cyan color for passing lights other than red light, green color for passing light of green color, yellow color for passing lights other than blue light.

15. A solid state color imaging apparatus in accordance with claim 6, wherein
said change of phase per one horizontal line is substantially 90°.

16. A solid state color imaging apparatus in accordance with claim 15, wherein
said phases of the repetition of the picture elements in the horizontal lines are changed for every horizontal lines which are scanned in sequence.

17. A solid state color imaging apparatus in accordance claim 16, wherein
said color filter comprises stripes of color filter elements of red color for passing red light, green color for passing green light and cyan color for passing lights other than red light.

18. A solid state color imaging apparatus in accordance with claim 16, wherein
said color filter comprises stripes of color filter elements of transparent or translucent for passing lights of all colors, cyan color for passing lights other than red light, green color for passing light of green color, yellow color for passing lights other than blue light.

19. A solid state color imaging apparatus in accordance with claim 15, wherein
said phases of repetition of the stripes of the color filter element in the horizontal lines are changed for every horizontal lines which are scanned in sequence by disposing said stripes of the color filter elements oblique to said horizontal lines.

20. A solid state color imaging apparatus in accordance with claim 19, wherein
said color filter comprises stripes of color filter elements of red color for passing red light, green color for passing green light and cyan color for passing lights other than red light.

21. A solid state color imaging apparatus in accordance with claim 19, wherein
said color filter comprises stripes of color filter elements of transparent or translucent for passing lights of all colors, cyan color for passing lights other than red light, green color for passing light of green color, yellow color for passing lights other than blue light.

* * * * *